(12) United States Patent
Hsu et al.

(10) Patent No.: US 8,053,969 B2
(45) Date of Patent: Nov. 8, 2011

(54) LED PACKAGE STRUCTURE FOR INCREASING LIGHT-EMITTING EFFICIENCY

(75) Inventors: Chi-Hsing Hsu, Taipei (TW); Chun-Yu Lu, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 8 days.

(21) Appl. No.: 12/781,193

(22) Filed: May 17, 2010

(65) Prior Publication Data

US 2011/0215695 A1  Sep. 8, 2011

(30) Foreign Application Priority Data

Mar. 3, 2010  (TW) .............................. 99203786 U

(51) Int. Cl.
    *H01J 1/62* (2006.01)
(52) U.S. Cl. ...................................... 313/498; 313/512
(58) Field of Classification Search .................. 313/498, 313/506, 512
    See application file for complete search history.

(56) References Cited

U.S. PATENT DOCUMENTS

| 6,670,751 | B2 * | 12/2003 | Song et al. | 313/512 |
| 7,176,623 | B2 * | 2/2007 | Nitta et al. | 313/512 |
| 7,656,083 | B2 * | 2/2010 | Sumitani | 313/498 |

* cited by examiner

*Primary Examiner* — Vip Patel
(74) *Attorney, Agent, or Firm* — Rosenberg, Klein & Lee

(57) ABSTRACT

An LED package structure for increasing light-emitting efficiency includes a heat-dissipating unit, an insulating unit, a light-emitting unit and a conductive unit. The heat-dissipating unit has a heat-dissipating substrate. The insulating unit has an insulating layer formed on the heat-dissipating substrate and at least one receiving groove passing through the insulating layer and formed above the heat-dissipating substrate. The insulating layer has a top surface on a top side thereof and an inner surface, and the inner surface of the insulating layer is an annular inclined surface in the receiving groove. The light-emitting unit has at least one light-emitting element received in the receiving groove and disposed on the heat-dissipating substrate. The conductive unit has at least two conductive structures disposed on the insulating layer and separated from each other, and the light-emitting element has two electrodes respectively electrically connected to the two conductive structures via two conductive wires.

20 Claims, 6 Drawing Sheets

LED PACKAGE STRUCTURE FOR INCREASING LIGHT-EMITTING EFFICIENCY

BACKGROUND OF THE INVENTION

1. Field of the Invention

The present invention relates to an LED package structure, and more particularly, to an LED package structure for increasing light-emitting efficiency.

2. Description of Related Art

The invention of the lamp greatly changed the style of building construction and the living style of human beings, allowing people to work during the night. Without the invention of the lamp, we may stay in the living conditions of ancient civilizations.

Various lamps such as incandescent bulbs, fluorescent bulbs, power-saving bulbs and etc. have been intensively used for indoor illumination. These lamps commonly have the disadvantages of quick attenuation, high power consumption, high heat generation, short working life, high fragility, and being not recyclable. Hence, LED package structure is created in order to solve the above-mentioned questions of the prior lamp.

Referring to FIG. 1, the prior art provides a first type of an LED package structure including a heat-dissipating substrate 10a, an insulating layer 20a, a light-emitting element 40a and two conductive layers 50a. The insulating layer 20a is formed on the heat-dissipating substrate 10a and around the light-emitting element 40a. The light-emitting element 40a is disposed on the heat-dissipating substrate 10a and is electrically connected between the two conductive layers 50a via two conductive wires W. However, lateral light beams L generated by the light-emitting element 40a cannot be reflected effectively by the inner surface of the insulating layer 20a, so that the lateral light beams L cannot be used effectively. Hence, the light-emitting efficiency of the first type of the LED package structure cannot be increased.

Referring to FIG. 2, the prior art provides a second type of an LED package structure including a heat-dissipating substrate 10b, an insulating layer 20b, a light-emitting element 40b and two conductive layers 50b. The heat-dissipating substrate 10b has a receiving groove 100b that is formed by a cutting tool. The insulating layer 20b is formed on the heat-dissipating substrate 10b and around the light-emitting element 40b. The light-emitting element 40b is disposed in the receiving groove 100b of the heat-dissipating substrate 10b and is electrically connected between the two conductive layers 50b via two conductive wires W. However, although lateral light beams L generated by the light-emitting element 40b can be reflected effectively by the inclined surface in the receiving groove 100b of the heat-dissipating substrate 10b, the manufacturing cost and time of the second type of the LED package structure is increased due to the process of slowly forming the receiving groove 100b by the cutting tool. Hence, the production efficiency of the second type of the LED package structure cannot be increased.

SUMMARY OF THE INVENTION

One particular aspect of the present invention is to provide an LED package structure for increasing light-emitting efficiency and decreasing manufacturing cost and time.

In order to achieve the above-mentioned aspects, the present invention provides an LED package structure for increasing light-emitting efficiency, including: a heat-dissipating unit, an insulating unit, a light-emitting unit and a conductive unit. The heat-dissipating unit has at least one heat-dissipating substrate. The insulating unit has at least one insulating layer formed on the at least one heat-dissipating substrate and at least one receiving groove passing through the at least one insulating layer and formed above the at least one heat-dissipating substrate. The at least one insulating layer has a top surface on a top side thereof and an inner surface, and the inner surface of the at least one insulating layer is an annular inclined surface in the at least one receiving groove. The light-emitting unit has at least one light-emitting element received in the at least one receiving groove and disposed on the at least one heat-dissipating substrate. The conductive unit has at least two conductive structures disposed on the at least one insulating layer and separated from each other, and the at least one light-emitting element has two electrodes respectively electrically connected to the at least two conductive structures via two conductive wires.

In order to achieve the above-mentioned aspects, the present invention provides an LED package structure for increasing light-emitting efficiency, including: a heat-dissipating unit, an insulating unit, a heat-conducting unit, a light-emitting unit and a conductive unit. The heat-dissipating unit has at least one heat-dissipating substrate. The insulating unit has at least one insulating layer formed on the at least one heat-dissipating substrate and at least one receiving groove passing through the at least one insulating layer and formed above the at least one heat-dissipating substrate. The at least one insulating layer has a top surface on a top side thereof and an inner surface, and the inner surface of the at least one insulating layer is an annular inclined surface in the at least one receiving groove. The heat-conducting unit has at least one heat-conducting layer formed on the at least one heat-dissipating substrate and on the annular inclined surface of the at least one insulating layer, and the at least one heat-conducting layer has a receiving groove formed on a top surface thereof and above the at least one receiving groove of the insulating unit and an annular inclined surface formed above the annular inclined surface of the at least one insulating layer. The light-emitting unit has at least one light-emitting element disposed on the at least one heat-conducting layer and received in the at least one receiving groove of the at least one heat-conducting layer. The conductive unit has at least two conductive structures disposed on the at least one insulating layer and separated from each other, and the at least one light-emitting element is electrically connected between the at least two conductive structures.

In order to achieve the above-mentioned aspects, the present invention provides an LED package structure for increasing light-emitting efficiency, including: a heat-dissipating unit, an insulating unit, a heat-conducting unit, a light-emitting unit and a conductive unit. The heat-dissipating unit has at least one heat-dissipating substrate. The insulating unit has at least one insulating layer formed on the at least one heat-dissipating substrate and at least one receiving groove passing through the at least one insulating layer and formed above the at least one heat-dissipating substrate. The at least one insulating layer has a top surface on a top side thereof and an inner surface, and the inner surface of the at least one insulating layer is an annular inclined surface in the at least one receiving groove. The heat-conducting unit has at least one heat-conducting structure formed on the at least one heat-dissipating substrate and on the annular inclined surface of the at least one insulating layer. The at least one heat-conducting structure is composed of at least two heat-conducting layers, and the at least one heat-conducting structure has a receiving groove formed on a top surface thereof and above the at least one receiving groove of the insulating unit and an annular inclined surface formed above the annular inclined surface of the at least one insulating layer. The light-emitting unit has at least one light-emitting element disposed on the at least one heat-conducting structure and received in the at least one receiving groove of the at least one heat-conducting structure. The conductive unit has at least two conductive structures disposed on the at least one insulating layer and separated from each other, and the at least one light-emitting element is electrically connected between the at least two conductive structures.

Therefore, the lateral light beams generated by the light-emitting element can be effectively reflected by the annular inclined surface of the insulating layer, the annular inclined surface of the heat-conducting layer or the annular inclined surface of the heat-conducting structure. In other words, the lateral light beams generated by the light-emitting element can be effectively used, so that the light-emitting efficiency of the present invention can be effectively increased.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are provided solely for reference and illustration, without any intention that they be used for limiting the present invention.

DETAILED DESCRIPTION OF THE PREFERRED EMBODIMENTS

Figure 1:
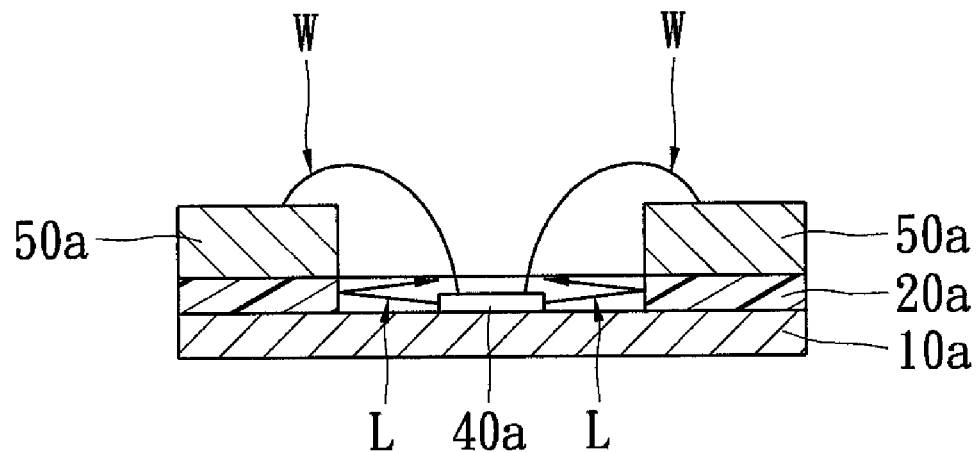
FIG. 1 is a lateral, cross-sectional, schematic view of the first type of the LED package structure according to the related art.
Figure 2:
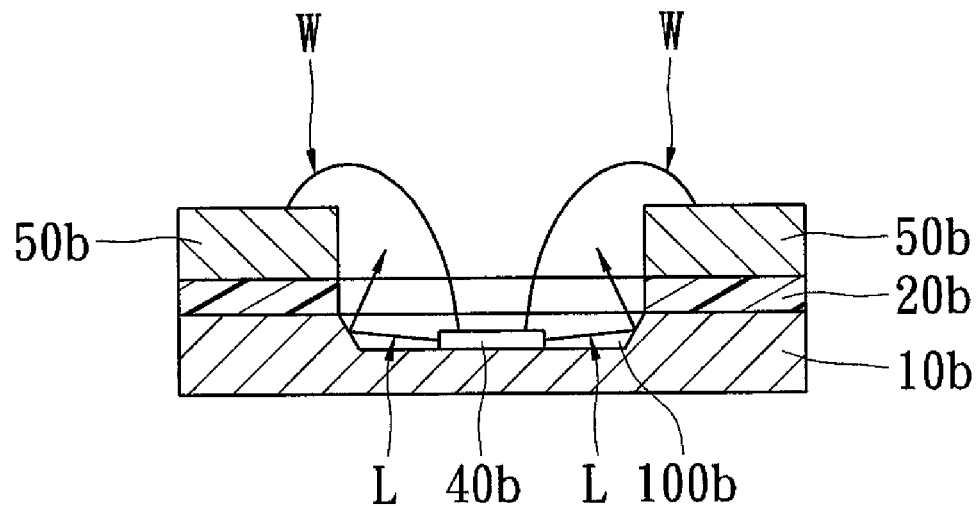
FIG. 2 is a lateral, cross-sectional, schematic view of the second type of the LED package structure according to the related art.
Figure 3:
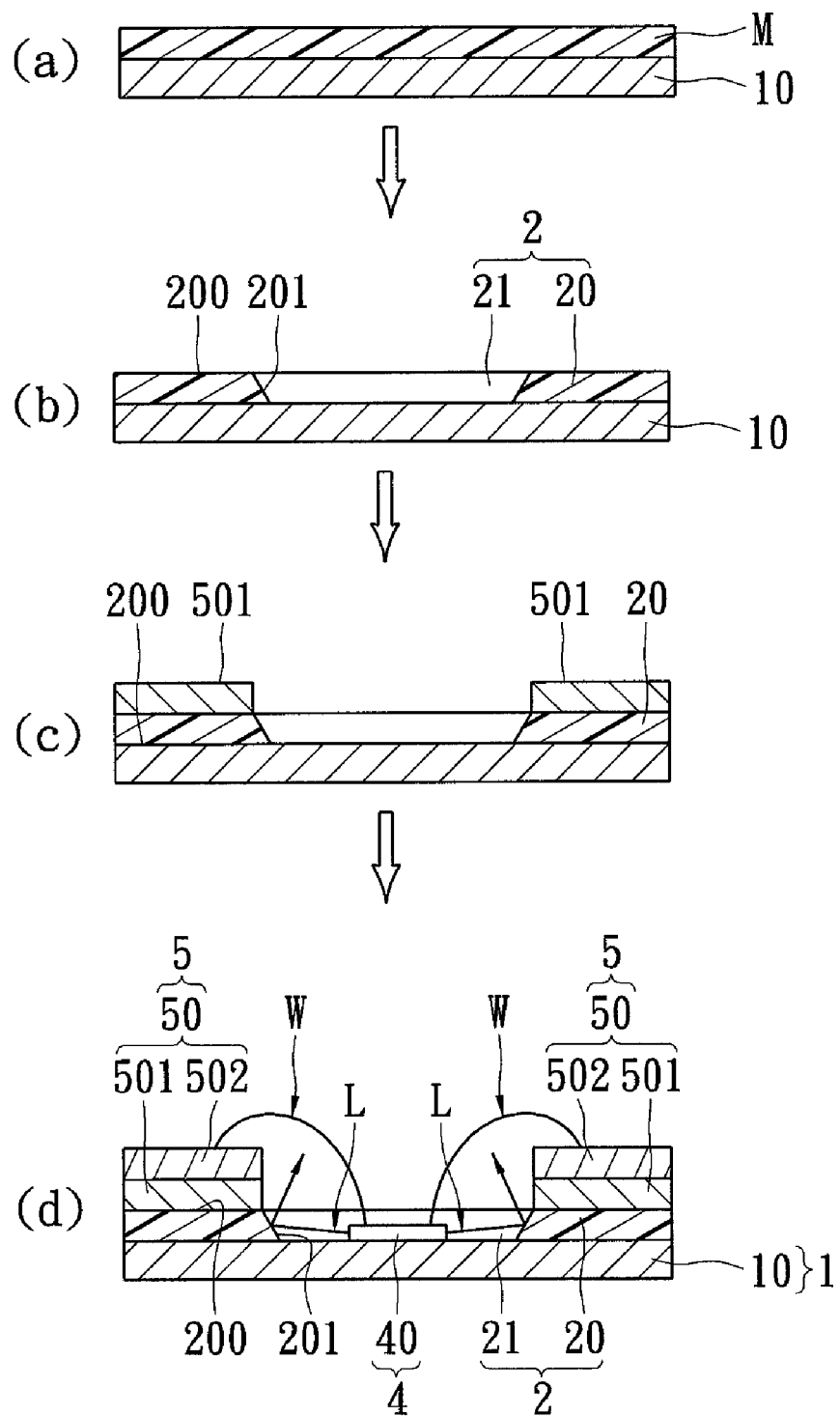
FIG. 3 is a process flowchart of the method for manufacturing an LED package structure for increasing light-emitting efficiency according to the first embodiment of the present invention.

Referring to FIG. 3, the first embodiment of the present invention provides a method for manufacturing an LED package structure for increasing light-emitting efficiency, including the following steps:

The step (a) is: providing at least one heat-dissipating substrate 10 and forming at least one insulating material M on the heat-dissipating substrate 10. In addition, the heat-dissipating substrate 10 may be an aluminum substrate, a copper substrate or any substrate with heat-conducting or heat-dissipating function.

The step (b) is: removing one part of the insulating material M by etching or any forming method to form an insulating unit 2 for exposing one part of the top surface of the heat-dissipating substrate 10. The insulating unit 2 has at least one insulating layer 20 formed on the heat-dissipating substrate 10 and at least one receiving groove 21 passing through the insulating layer 20 and formed above the heat-dissipating substrate 10. In addition, the insulating layer 20 has a top surface 200 on a top side thereof and an inner surface, and the inner surface of the insulating layer 20 is an annular inclined surface 201 in the receiving groove 21.

The step (c) is: forming at least two first conductive layers 501 on the top surface 200 of the insulating layer 20 by a semiconductor forming method.

The step (d) is: respectively forming at least two second conductive layers 502 on the two first conductive layers 501 by a semiconductor forming method and then placing at least one light-emitting element 40 on the exposed top surface of the heat-dissipating substrate 10. In addition, the light-emitting element 40 is electrically connected between the two second conductive layers 502 via two conductive wires W.

Referring to the step (d) of FIG. 3, the first embodiment of the present invention provides an LED package structure for increasing light-emitting efficiency, including: a heat-dissipating unit 1, an insulating unit 2, a light-emitting unit 4 and a conductive unit 5.

The heat-dissipating unit 1 has at least one heat-dissipating substrate 10, and the heat-dissipating substrate 10 may be an aluminum substrate, a copper substrate or any substrate with heat-conducting or heat-dissipating function. Moreover, the insulating unit 2 has at least one insulating layer 20 formed on the heat-dissipating substrate 10 and at least one receiving groove 21 passing through the insulating layer 20 and formed above the heat-dissipating substrate 10. In addition, the insulating layer 20 has a top surface 200 on a top side thereof and an inner surface, and the inner surface of the insulating layer 20 is an annular inclined surface 201 in the receiving groove 21.

Furthermore, the light-emitting unit 4 has at least one light-emitting element 40 received in the receiving groove 21 and disposed on the heat-dissipating substrate 10, and the light-emitting element 40 may be an LED chip or any light-emitting component according to different requirements. In addition, the conductive unit 5 has at least two conductive structures 50 disposed on the insulating layer 20 and separated from each other, and the light-emitting element 40 has two electrodes respectively electrically connected to the two conductive structures 50 via two conductive wires W.

For example, the annular inclined surface 201 of the insulating layer 20 may be an exposed reflecting surface for reflecting lateral light beams L generated by the light-emitting element 40. In addition, each conductive structure 50 has at least one first conductive layer 501 formed on the top surface 200 of the insulating layer 20 and at least one second conductive layer 502 formed a top surface of each first conductive layer 501. The first conductive layer 501 may be a copper layer or any conductive substance, and the second conductive layer 502 may be a silver layer, a gold layer or any substance for retaining the conductive wire W on the second conductive layer 502. Besides, one part of each conductive structure 50 may be formed on the annular inclined surface 201 of the insulating layer 20, so that one part of each conductive structure 50 may be a reflection layer for reflecting the lateral light beams L generated by the light-emitting element 40.

Hence, the lateral light beams L generated by the light-emitting element 40 can be effectively reflected by the annular inclined surface 201 of the insulating layer 20. In other words, the lateral light beams L generated by the light-emitting element 40 can be effectively used, so that the light-emitting efficiency of the present invention can be effectively increased.

Figure 4:
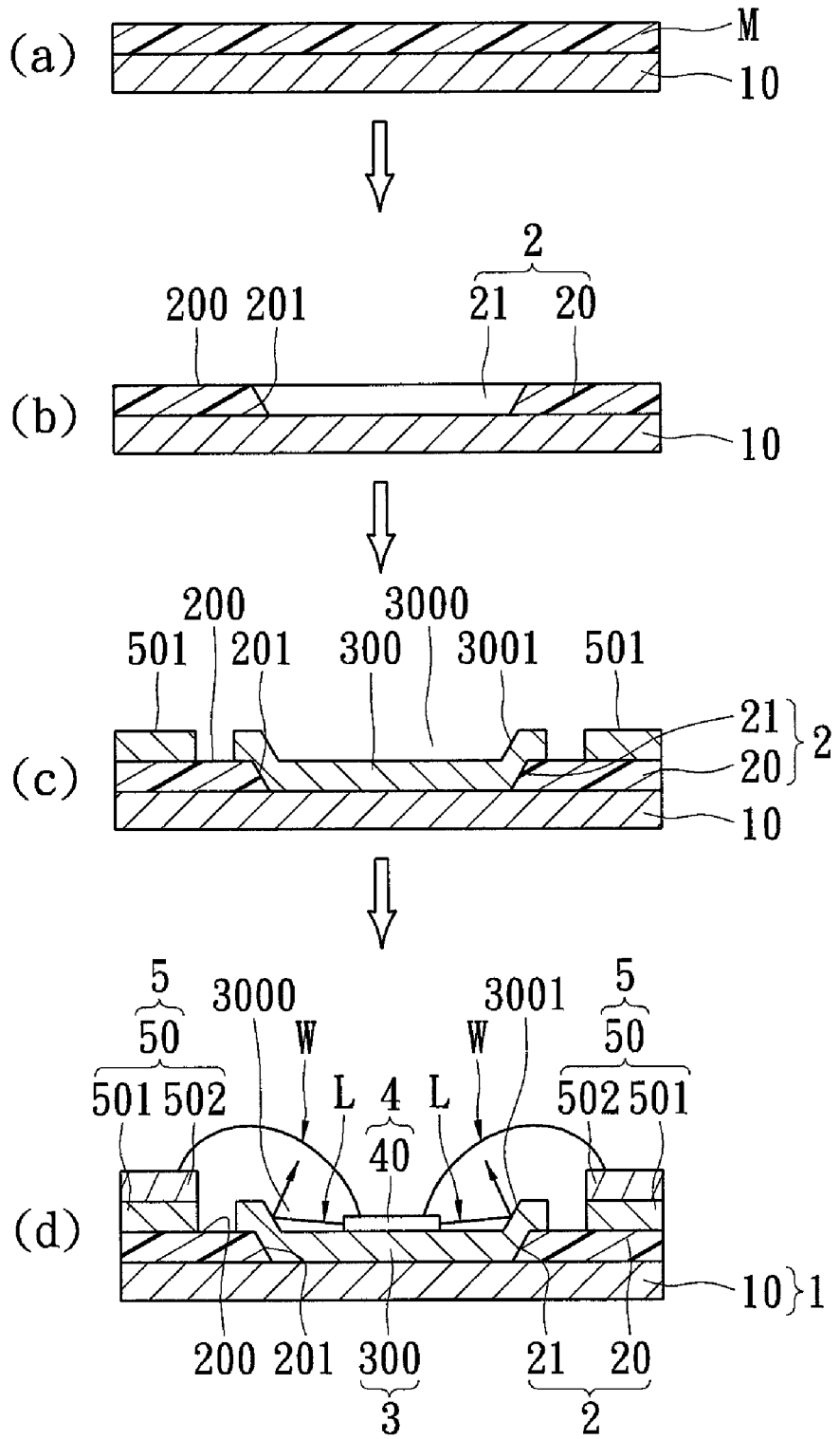
FIG. 4 is a process flowchart of the method for manufacturing an LED package structure for increasing light-emitting efficiency according to the second embodiment of the present invention.

Referring to FIG. 4, the second embodiment of the present invention provides a method for manufacturing an LED package structure for increasing light-emitting efficiency, including the following steps:

The step (a) is: providing at least one heat-dissipating substrate 10 and forming at least one insulating material M on the heat-dissipating substrate 10. In addition, the heat-dissipating substrate 10 may be an aluminum substrate, a copper substrate or any substrate with heat-conducting or heat-dissipating function.

The step (b) is: removing one part of the insulating material M by etching or any forming method to form an insulating unit 2 for exposing one part of the top surface of the heat-dissipating substrate 10. The insulating unit 2 has at least one insulating layer 20 formed on the heat-dissipating substrate 10 and at least one receiving groove 21 passing through the insulating layer 20 and formed above the heat-dissipating substrate 10. In addition, the insulating layer 20 has a top surface 200 on a top side thereof and an inner surface, and the inner surface of the insulating layer 20 is an annular inclined surface 201 in the receiving groove 21.

The step (c) is: forming at least two first conductive layers 501 on the top surface 200 of the insulating layer 20 by a semiconductor forming method and forming at least one heat-conducting layer 300 on the heat-dissipating substrate 10 and the annular inclined surface 201 of the insulating layer 20. Of course, the heat-conducting layer 300 also can be formed on one part of the top surface 200 of the insulating layer 20. In addition, the heat-conducting layer 300 has a receiving groove 3000 formed on a top surface thereof and above the receiving groove 21 of the insulating unit 2 and an annular inclined surface 3001 formed above the annular inclined surface 201 of the insulating layer 20.

The step (d) is: respectively forming at least two second conductive layers 502 on the two first conductive layers 501 by a semiconductor forming method and then placing at least one light-emitting element 40 on the heat-conducting layer 300 to electrically connect between the two second conductive layers 502 via two conductive wires W.

Referring to the step (d) of FIG. 4, the second embodiment of the present invention provides an LED package structure for increasing light-emitting efficiency, including: a heat-dissipating unit 1, an insulating unit 2, a heat-conducting unit 3, a light-emitting unit 4 and a conductive unit 5.

The heat-dissipating unit 1 has at least one heat-dissipating substrate 10, and the heat-dissipating substrate 10 may be an aluminum substrate, a copper substrate or any substrate with heat-conducting or heat-dissipating function. Moreover, the insulating unit 2 has at least one insulating layer 20 formed on the heat-dissipating substrate 10 and at least one receiving groove 21 passing through the insulating layer 20 and formed above the heat-dissipating substrate 10. In addition, the insulating layer 20 has a top surface 200 on a top side thereof and an inner surface, and the inner surface of the insulating layer 20 is an annular inclined surface 201 in the receiving groove 21.

Moreover, the heat-conducting unit 3 has at least one heat-conducting layer 300 formed on the heat-dissipating substrate 10 and on the annular inclined surface 201 of the insulating layer 20. In addition, the heat-conducting layer 300 has a receiving groove 3000 formed on a top surface thereof and above the receiving groove 21 of the insulating unit 2 and an annular inclined surface 3001 formed above the annular inclined surface 201 of the insulating layer 20.

Furthermore, the light-emitting unit 4 has at least one light-emitting element 40 disposed on the heat-conducting layer 300 and received in the receiving groove 3000 of the heat-conducting layer 300. In addition, the conductive unit 5 has at least two conductive structures 50 disposed on the insulating layer 20 and separated from each other, and the light-emitting element 40 is electrically connected between the two conductive structures 50.

For example, the annular inclined surface 3001 of the heat-conducting layer 300 is an exposed reflecting surface for reflecting lateral light beams L generated by the light-emitting element 40. In addition, each conductive structure 50 has at least one first conductive layer 501 formed on the top surface 200 of the insulating layer 20 and at least one second conductive layer 502 formed a top surface of each first conductive layer 501. The first conductive layer 501 and the heat-conducting layer 300 are made of the same material. The heat-conducting layer 300 is disposed between the two conductive structures 50, the heat-conducting layer 300 has two opposite sides respectively separated from the two conductive structures 50, and the light-emitting element 40 has two electrodes respectively electrically connected to the two conductive structures 50 via two conductive wires W.

Hence, the lateral light beams L generated by the light-emitting element 40 can be effectively reflected by the annular inclined surface 3001 of the heat-conducting layer 300. In other words, the lateral light beams L generated by the light-emitting element 40 can be effectively used, so that the light-emitting efficiency of the present invention can be effectively increased.

Figure 5:
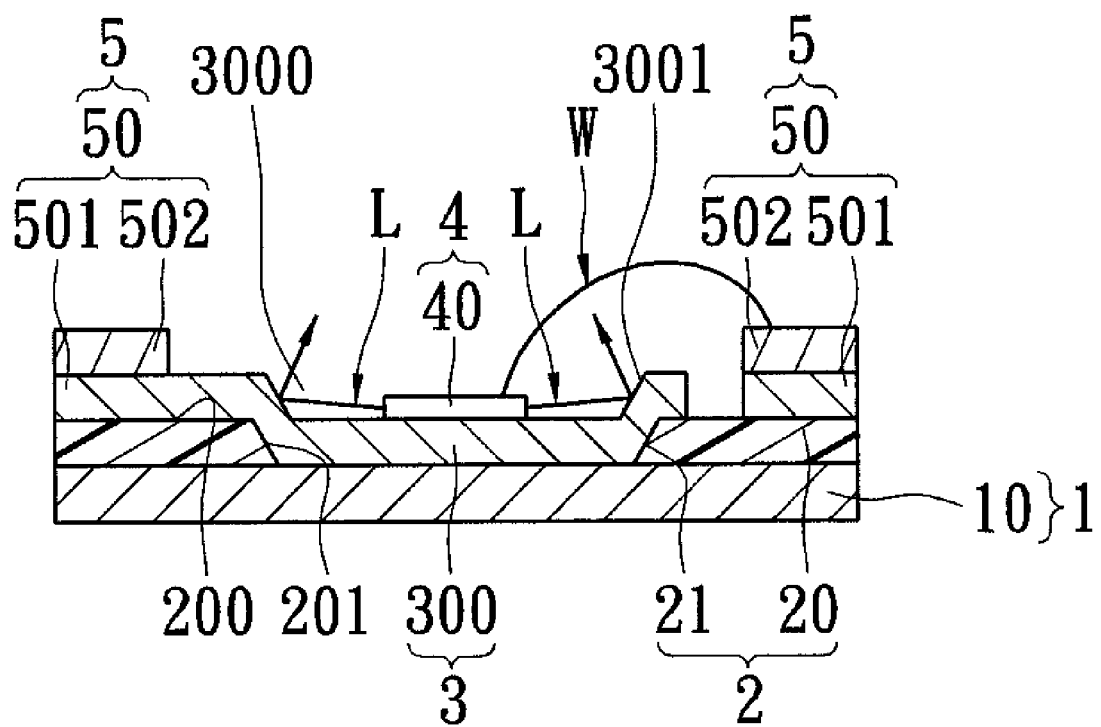
FIG. 5 is a lateral, cross-sectional, schematic view of the LED package structure for increasing light-emitting efficiency according to the third embodiment of the present invention.

Referring to FIG. 5, the third embodiment of the present invention provides an LED package structure for increasing light-emitting efficiency, including: a heat-dissipating unit 1, an insulating unit 2, a heat-conducting unit 3, a light-emitting unit 4 and a conductive unit 5. The difference between the third embodiment and the second embodiment is that: in the third embodiment, the heat-conducting layer 300 is disposed between the two conductive structures 50, one lateral side of the heat-conducting layer 300 is connected to first one of the two conductive structures 50 (it means the heat-conducting layer 300 and one conductive structure 50 are integrated with each other), and another lateral side of the heat-conducting layer 300 is separated from second one of the two conductive structures 50. In addition, the light-emitting element 40 has one electrode electrically contacted to the first one of the two conductive structures 50 via the heat-conducting layer 300 (it means the heat and the electricity are combined), and the light-emitting element 40 has another electrode electrically connected to the second one of the two conductive structures 50 via a conductive wire W (it means the heat and the electricity are separated).

Figure 6:
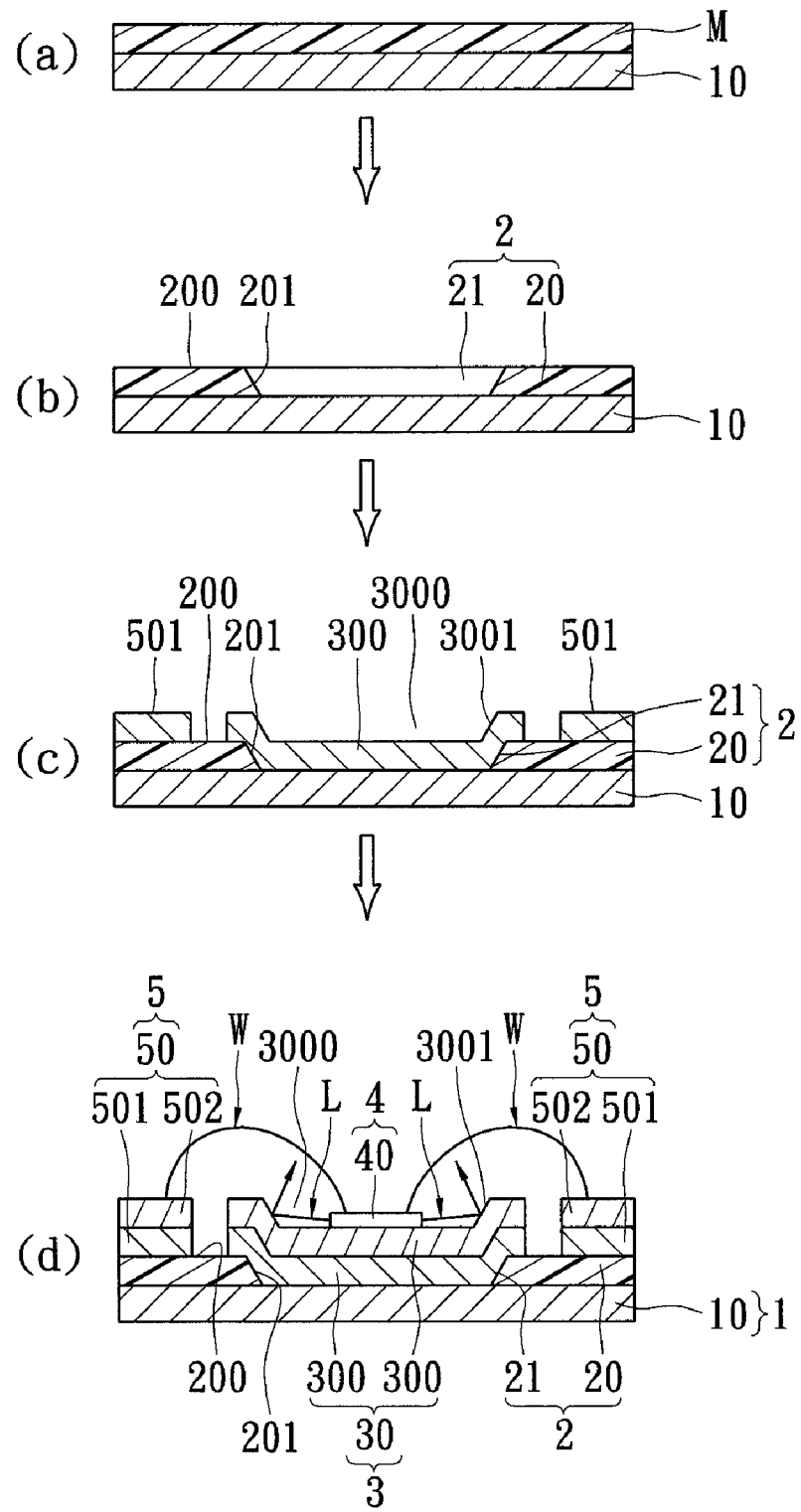
FIG. 6 is a process flowchart of the method for manufacturing an LED package structure for increasing light-emitting efficiency according to the fourth embodiment of the present invention.

Referring to FIG. 6, the fourth embodiment of the present invention provides a method for manufacturing an LED package structure for increasing light-emitting efficiency, including the following steps:

The step (a) is: providing at least one heat-dissipating substrate 10 and forming at least one insulating material M on the heat-dissipating substrate 10. In addition, the heat-dissipating substrate 10 may be an aluminum substrate, a copper substrate or any substrate with heat-conducting or heat-dissipating function.

The step (b) is: removing one part of the insulating material M by etching or any forming method to form an insulating unit 2 for exposing one part of the top surface of the heat-dissipating substrate 10. The insulating unit 2 has at least one insulating layer 20 formed on the heat-dissipating substrate 10 and at least one receiving groove 21 passing through the insulating layer 20 and formed above the heat-dissipating substrate 10. In addition, the insulating layer 20 has a top surface 200 on a top side thereof and an inner surface, and the inner surface of the insulating layer 20 is an annular inclined surface 201 in the receiving groove 21.

The step (c) is: forming at least two first conductive layers 501 on the top surface 200 of the insulating layer 20 by a semiconductor forming method and forming at least one first heat-conducting layer 300 on the heat-dissipating substrate 10 and the annular inclined surface 201 of the insulating layer 20. Of course, the first heat-conducting layer 300 also can be formed on one part of the top surface 200 of the insulating layer 20. In addition, the first heat-conducting layer 300 has a receiving groove 3000 formed on a top surface thereof and above the receiving groove 21 of the insulating unit 2 and an annular inclined surface 3001 formed above the annular inclined surface 201 of the insulating layer 20.

The step (d) is: respectively forming at least two second conductive layers 502 on the two first conductive layers 501 by a semiconductor forming method and forming at least one second heat-conducting layer 300 on the first heat-conducting layer 300, and then placing at least one light-emitting element 40 on the second heat-conducting layer 300 to electrically connect between the two second conductive layers 502 via two conductive wires W.

Referring to the step (d) of FIG. 6, the fourth embodiment of the present invention provides an LED package structure for increasing light-emitting efficiency, including: a heat-dissipating unit 1, an insulating unit 2, a heat-conducting unit 3, a light-emitting unit 4 and a conductive unit 5.

The heat-dissipating unit 1 has at least one heat-dissipating substrate 10, and the heat-dissipating substrate 10 may be an aluminum substrate, a copper substrate or any substrate with heat-conducting or heat-dissipating function. Moreover, the insulating unit 2 has at least one insulating layer 20 formed on the heat-dissipating substrate 10 and at least one receiving groove 21 passing through the insulating layer 20 and formed above the heat-dissipating substrate 10. In addition, the insulating layer 20 has a top surface 200 on a top side thereof and an inner surface, and the inner surface of the insulating layer 20 is an annular inclined surface 201 in the receiving groove 21.

Moreover, the heat-conducting unit 3 has at least one heat-conducting structure 30 formed on the heat-dissipating substrate 10 and on the annular inclined surface 201 of the insulating layer 20. In addition, the heat-conducting structure 30 is composed of at least two heat-conducting layers 300, and the heat-conducting structure 30 has a receiving groove 3000 formed on a top surface thereof and above the receiving groove 21 of the insulating unit 2 and an annular inclined surface 3001 formed above the annular inclined surface 201 of the insulating layer 20.

Furthermore, the light-emitting unit 4 has at least one light-emitting element 40 disposed on the heat-conducting structure 30 and received in the receiving groove 3000 of the heat-conducting structure 30. In addition, the conductive unit 5 has at least two conductive structures 50 disposed on the insulating layer 20 and separated from each other, and the light-emitting element 40 is electrically connected between the two conductive structures 50.

For example, the annular inclined surface 3001 of the heat-conducting structure 30 is an exposed reflecting surface for reflecting lateral light beams L generated by the light-emitting element 40. In addition, each conductive structure 50 has at least one first conductive layer 501 formed on the top surface 200 of the insulating layer 20 and at least one second conductive layer 502 formed a top surface of each first conductive layer 501. One of the two heat-conducting layers 300 and the first conductive layer 501 are made of the same material, and another one of the two heat-conducting layers 300 and the second conductive layer 502 are made of the same material. The heat-conducting structure 30 is disposed between the two conductive structures 50, the heat-conducting structure 30 has two opposite sides respectively separated from the two conductive structures 50, and the light-emitting element 40 has two electrodes respectively electrically connected to the two conductive structures 50 via two conductive wires W.

Hence, the lateral light beams L generated by the light-emitting element 40 can be effectively reflected by the annular inclined surface 3001 of the heat-conducting structure 30. In other words, the lateral light beams L generated by the light-emitting element 40 can be effectively used, so that the light-emitting efficiency of the present invention can be effectively increased.

Figure 7:
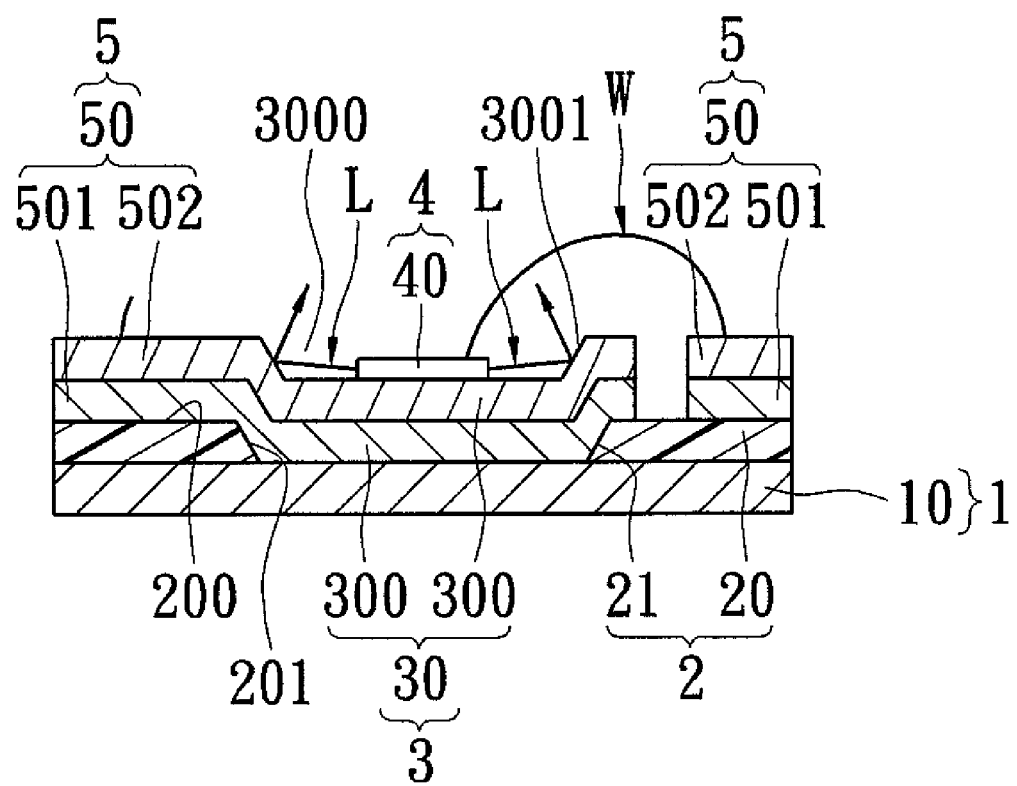
FIG. 7 is a lateral, cross-sectional, schematic view of the LED package structure for increasing light-emitting efficiency according to the fifth embodiment of the present invention.

Referring to FIG. 7, the fifth embodiment of the present invention provides an LED package structure for increasing light-emitting efficiency, including: a heat-dissipating unit 1, an insulating unit 2, a heat-conducting unit 3, a light-emitting unit 4 and a conductive unit 5. The difference between the fifth embodiment and the fourth embodiment is that: in the fifth embodiment, the heat-conducting structure 30 is disposed between the two conductive structures 50, one lateral side of the heat-conducting structure 30 is connected to first one of the two conductive structures 50 (it means the first heat-conducting layer 300 and the first conductive layer 501 are integrated with each other, and the second heat-conducting layer 300 and the second conductive layer 502 are integrated with each other), and another lateral side of the heat-conducting structure 30 is separated from second one of the two conductive structures 50. In addition, the light-emitting element 40 has one electrode electrically contacted to the first one of the two conductive structures 50 via the heat-conducting structure 30 (it means the heat and the electricity are combined), and the light-emitting element 40 has another electrode electrically connected to the second one of the two conductive structures 50 via a conductive wire W (it means the heat and the electricity are separated).

In conclusion, the lateral light beams generated by the light-emitting element can be effectively reflected by the annular inclined surface of the insulating layer, the annular inclined surface of the heat-conducting layer or the annular inclined surface of the heat-conducting structure. In other words, the lateral light beams generated by the light-emitting element can be effectively used, so that the light-emitting efficiency of the present invention can be effectively increased.

The above-mentioned descriptions merely represent solely the preferred embodiments of the present invention, without any intention or ability to limit the scope of the present invention which is fully described only within the following claims. Various equivalent changes, alterations or modifications based on the claims of present invention are all, consequently, viewed as being embraced by the scope of the present invention.

What is claimed is:

1. An LED package structure for increasing light-emitting efficiency, comprising:
   a heat-dissipating unit having at least one heat-dissipating substrate;
   an insulating unit having at least one insulating layer formed on the at least one heat-dissipating substrate and at least one receiving groove passing through the at least one insulating layer and formed above the at least one heat-dissipating substrate, wherein the at least one insulating layer has a top surface on a top side thereof and an inner surface, and the inner surface of the at least one insulating layer is an annular inclined surface in the at least one receiving groove;
   a light-emitting unit having at least one light-emitting element received in the at least one receiving groove and disposed on the at least one heat-dissipating substrate; and
   a conductive unit having at least two conductive structures disposed on the at least one insulating layer and separated from each other, wherein the at least one light-emitting element has two electrodes respectively electrically connected to the at least two conductive structures via two conductive wires.

2. The LED package structure according to claim 1, wherein the at least one heat-dissipating substrate is an aluminum substrate or a copper substrate.

3. The LED package structure according to claim 1, wherein the at least one light-emitting element is an LED chip.

4. The LED package structure according to claim 1, wherein each conductive structure has at least one first conductive layer formed on the top surface of the at least one insulating layer and at least one second conductive layer formed a top surface of each first conductive layer, and the annular inclined surface of the at least one insulating layer is an exposed reflecting surface for reflecting lateral light beams generated by the at least one light-emitting element.

5. The LED package structure according to claim 4, wherein the at least one first conductive layer is a copper layer, and the at least one second conductive layer is a silver layer or a gold layer.

6. An LED package structure for increasing light-emitting efficiency, comprising:
   a heat-dissipating unit having at least one heat-dissipating substrate;
   an insulating unit having at least one insulating layer formed on the at least one heat-dissipating substrate and at least one receiving groove passing through the at least one insulating layer and formed above the at least one heat-dissipating substrate, wherein the at least one insulating layer has a top surface on a top side thereof and an inner surface, and the inner surface of the at least one insulating layer is an annular inclined surface in the at least one receiving groove;
   a heat-conducting unit having at least one heat-conducting layer formed on the at least one heat-dissipating substrate and on the annular inclined surface of the at least one insulating layer, wherein the at least one heat-conducting layer has a receiving groove formed on a top surface thereof and above the at least one receiving groove of the insulating unit and an annular inclined surface formed above the annular inclined surface of the at least one insulating layer;
   a light-emitting unit having at least one light-emitting element disposed on the at least one heat-conducting layer and received in the at least one receiving groove of the at least one heat-conducting layer; and
   a conductive unit having at least two conductive structures disposed on the at least one insulating layer and separated from each other, wherein the at least one light-emitting element is electrically connected between the at least two conductive structures.

7. The LED package structure according to claim 6, wherein the at least one heat-dissipating substrate is an aluminum substrate or a copper substrate.

8. The LED package structure according to claim 6, wherein the annular inclined surface of the at least one heat-conducting layer is an exposed reflecting surface for reflecting lateral light beams generated by the at least one light-emitting element.

9. The LED package structure according to claim 6, wherein the at least one light-emitting element is an LED chip.

10. The LED package structure according to claim 6, wherein each conductive structure has at least one first conductive layer formed on the top surface of the at least one insulating layer and at least one second conductive layer formed a top surface of each first conductive layer, and the at least one first conductive layer and the at least one heat-conducting layer are made of the same material.

11. The LED package structure according to claim 10, wherein the at least one first conductive layer is a copper layer, and the at least one second conductive layer is a silver layer or a gold layer.

12. The LED package structure according to claim 6, wherein the at least one heat-conducting layer is disposed between the at least two conductive structures, the at least one heat-conducting layer has two opposite sides respectively separated from the at least two conductive structures, and the at least one light-emitting element has two electrodes respectively electrically connected to the at least two conductive structures via two conductive wires.

13. The LED package structure according to claim 6, wherein the at least one heat-conducting layer is disposed between the at least two conductive structures, one lateral side of the at least one heat-conducting layer is connected to first one of the at least two conductive structures, another lateral side of the at least one heat-conducting layer is separated from second one of the at least two conductive structures, the at least one light-emitting element has one electrode electrically contacted to the first one of the at least two conductive structures via the at least one heat-conducting layer, and the at least one light-emitting element has another electrode electrically connected to the second one of the at least two conductive structures via a conductive wire.

14. An LED package structure for increasing light-emitting efficiency, comprising:
   a heat-dissipating unit having at least one heat-dissipating substrate;
   an insulating unit having at least one insulating layer formed on the at least one heat-dissipating substrate and at least one receiving groove passing through the at least one insulating layer and formed above the at least one heat-dissipating substrate, wherein the at least one insulating layer has a top surface on a top side thereof and an inner surface, and the inner surface of the at least one insulating layer is an annular inclined surface in the at least one receiving groove;
   a heat-conducting unit having at least one heat-conducting structure formed on the at least one heat-dissipating substrate and on the annular inclined surface of the at least one insulating layer, wherein the at least one heat-conducting structure is composed of at least two heat-conducting layers, and the at least one heat-conducting structure has a receiving groove formed on a top surface thereof and above the at least one receiving groove of the insulating unit and an annular inclined surface formed above the annular inclined surface of the at least one insulating layer;

a light-emitting unit having at least one light-emitting element disposed on the at least one heat-conducting structure and received in the at least one receiving groove of the at least one heat-conducting structure; and a conductive unit having at least two conductive structures disposed on the at least one insulating layer and separated from each other, wherein the at least one light-emitting element is electrically connected between the at least two conductive structures.

15. The LED package structure according to claim 14, wherein the at least one heat-dissipating substrate is an aluminum substrate or a copper substrate.

16. The LED package structure according to claim 14, wherein the annular inclined surface of the at least one heat-conducting structure is an exposed reflecting surface for reflecting lateral light beams generated by the at least one light-emitting element.

17. The LED package structure according to claim 14, wherein each conductive structure has at least one first conductive layer formed on the top surface of the at least one insulating layer and at least one second conductive layer formed a top surface of each first conductive layer.

18. The LED package structure according to claim 17, wherein one of the at least two heat-conducting layers and the at least one first conductive layer are made of the same material, and another one of the at least two heat-conducting layers and the at least one second conductive layer are made of the same material.

19. The LED package structure according to claim 14, wherein the at least one heat-conducting structure is disposed between the at least two conductive structures, the at least one heat-conducting structure has two opposite sides respectively separated from the at least two conductive structures, and the at least one light-emitting element has two electrodes respectively electrically connected to the at least two conductive structures via two conductive wires.

20. The LED package structure according to claim 14, wherein the at least one heat-conducting structure is disposed between the at least two conductive structures, one lateral side of the at least one heat-conducting structure is connected to first one of the at least two conductive structures, another lateral side of the at least one heat-conducting structure is separated from second one of the at least two conductive structures, the at least one light-emitting element has one electrode electrically contacted to the first one of the at least two conductive structures via the at least one heat-conducting structure, and the at least one light-emitting element has another electrode electrically connected to the second one of the at least two conductive structures via a conductive wire.

* * * * *